(12) United States Patent
Han et al.

(10) Patent No.: US 8,258,631 B2
(45) Date of Patent: Sep. 4, 2012

(54) PAD LAYOUT STRUCTURE OF SEMICONDUCTOR CHIP

(75) Inventors: Dae-Keun Han, Daejeon-si (KR); Dae-Seong Kim, Daejeon-si (KR); Joon-Ho Na, Daejeon-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 141 days.

(21) Appl. No.: 12/600,901

(22) PCT Filed: Dec. 17, 2007

(86) PCT No.: PCT/KR2007/006573
§ 371 (c)(1),
(2), (4) Date: Nov. 19, 2009

(87) PCT Pub. No.: WO2008/150055
PCT Pub. Date: Dec. 11, 2008

(65) Prior Publication Data
US 2010/0155957 A1    Jun. 24, 2010

(30) Foreign Application Priority Data
Jun. 7, 2007    (KR) .................. 10-2007-0055311

(51) Int. Cl.
*H01L 23/48* (2006.01)
*H01L 23/52* (2006.01)
*H01L 29/40* (2006.01)
*H01L 27/10* (2006.01)
*H01L 29/73* (2006.01)

(52) U.S. Cl. ........ 257/773; 257/203; 257/206; 257/690; 257/775; 257/E23.015; 257/E23.02; 257/E23.151

(58) Field of Classification Search ................ 257/203, 257/206, 690, 773, 775, E23.015, E23.151, 257/E23.02
See application file for complete search history.

(56) References Cited

U.S. PATENT DOCUMENTS

| | | | | |
|---|---|---|---|---|
| 4,489,365 A | * | 12/1984 | Daberkoe | 361/768 |
| 5,299,169 A | * | 3/1994 | Miyamoto | 365/230.05 |
| 5,309,019 A | * | 5/1994 | Moline et al. | 257/670 |

(Continued)

FOREIGN PATENT DOCUMENTS

JP         60-072238       4/1985

(Continued)

OTHER PUBLICATIONS

PCT International Search Report of International Application No. PCT/KR2007/006573.

(Continued)

*Primary Examiner* — Ida M Soward
(74) *Attorney, Agent, or Firm* — Kile Park Goekjian Reed & McManus PLLC

(57) ABSTRACT

Provided is a pad layout structure of a semiconductor chip capable of preventing lead-broken problems when packaging the semiconductor chip with a high aspect ratio in a tape carrier package (TCP). In the pad layout structure of the semiconductor chip, a plurality pads are arranged along upper, lower, left and right sides of the semiconductor chip with a high aspect ratio, and a longitudinal width of pads arranged at the left and right sides and a transverse width of pads arranged at both edges of the upper and lower sides are greater than a transverse width of pads arranged at centers of the upper and lower sides.

6 Claims, 3 Drawing Sheets

U.S. PATENT DOCUMENTS

| | | | |
|---|---|---|---|
| 5,347,150 A * | 9/1994 | Sakai et al. | 257/203 |
| 5,886,409 A * | 3/1999 | Ishino et al. | 257/737 |
| 6,130,474 A * | 10/2000 | Corisis | 257/676 |
| 6,191,491 B1 * | 2/2001 | Hiraga | 257/784 |
| 6,373,447 B1 * | 4/2002 | Rostoker et al. | 343/895 |
| 6,476,505 B2 * | 11/2002 | Nakamura | 257/786 |
| 6,480,013 B1 * | 11/2002 | Nayler et al. | 324/750.02 |
| 6,489,688 B1 * | 12/2002 | Baumann et al. | 257/786 |
| 6,493,056 B2 * | 12/2002 | Bjorkengren et al. | 349/151 |
| 6,770,963 B1 * | 8/2004 | Wu | 257/691 |
| 6,836,026 B1 * | 12/2004 | Ali et al. | 257/786 |
| 6,858,920 B2 * | 2/2005 | Hatauchi | 257/666 |
| 7,112,048 B2 * | 9/2006 | Lim et al. | 425/116 |
| 7,115,495 B2 * | 10/2006 | Wark et al. | 438/612 |
| 7,286,386 B2 * | 10/2007 | Miwa et al. | 365/63 |
| 7,579,683 B1 * | 8/2009 | Falik et al. | 257/690 |
| 7,687,893 B2 * | 3/2010 | Smith | 257/676 |
| 7,795,615 B2 * | 9/2010 | Goebel et al. | 257/48 |
| 7,915,718 B2 * | 3/2011 | Lee et al. | 257/668 |
| 8,138,611 B2 * | 3/2012 | Kuroda et al. | 257/777 |
| 2003/0151047 A1 * | 8/2003 | Corbett et al. | 257/48 |
| 2007/0045828 A1 * | 3/2007 | Kwon et al. | 257/723 |
| 2007/0069343 A1 * | 3/2007 | Takasou et al. | 257/666 |
| 2007/0148816 A1 * | 6/2007 | Davis et al. | 438/106 |
| 2008/0003805 A1 * | 1/2008 | Pang et al. | 438/613 |
| 2008/0079115 A1 * | 4/2008 | Wang | 257/531 |
| 2008/0191363 A1 * | 8/2008 | Plants et al. | 257/777 |
| 2008/0315432 A1 * | 12/2008 | Thoonen | 257/777 |
| 2009/0146273 A1 * | 6/2009 | Yamada et al. | 257/666 |
| 2010/0001393 A1 * | 1/2010 | Danno et al. | 257/692 |

FOREIGN PATENT DOCUMENTS

| | | |
|---|---|---|
| JP | 60-101938 | 6/1985 |
| JP | 60-206158 | 10/1985 |

OTHER PUBLICATIONS

PCT Written Opinion of the International Search Authority for International Application No. PCT/KR2007/006573.

* cited by examiner

[FIG. 1]
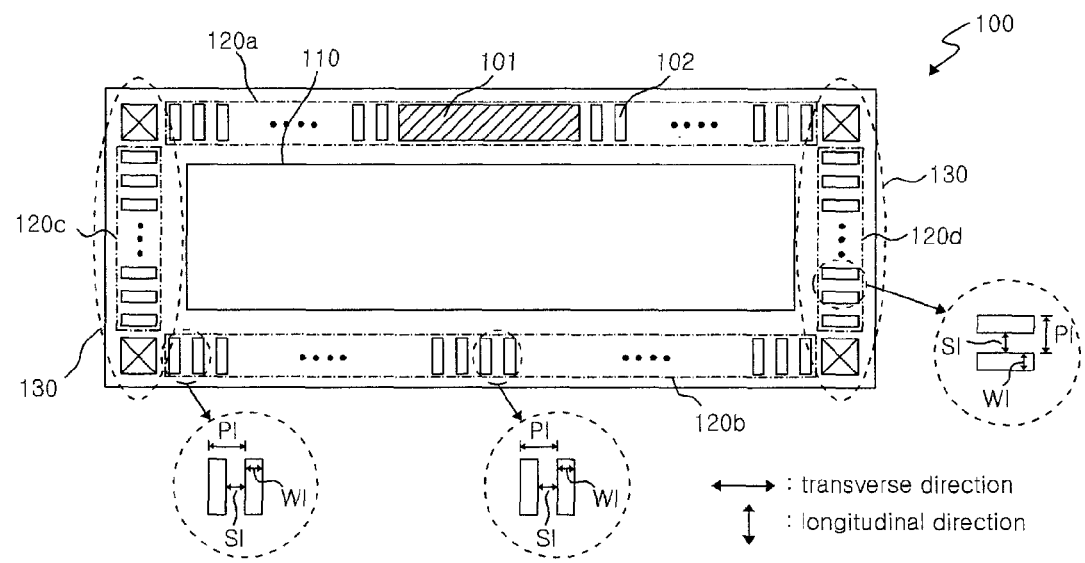
[FIG. 2]
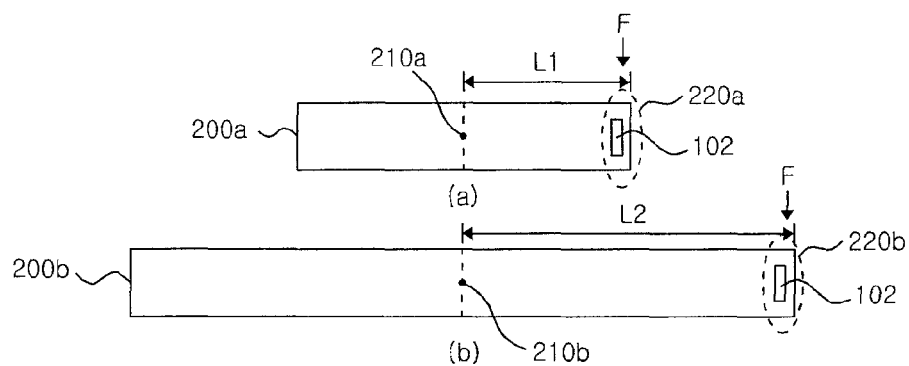

[FIG. 3]
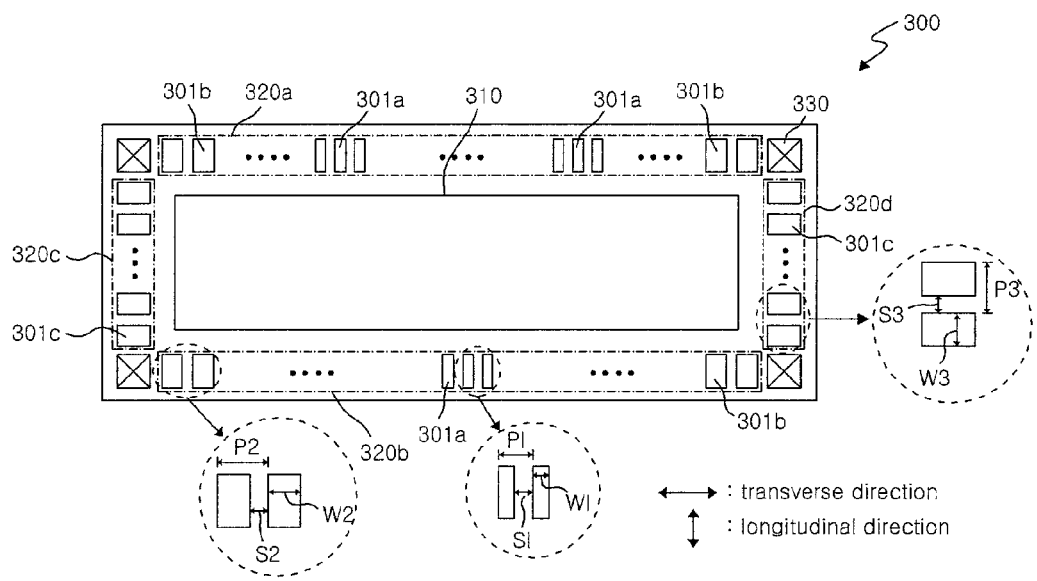
[FIG. 4]
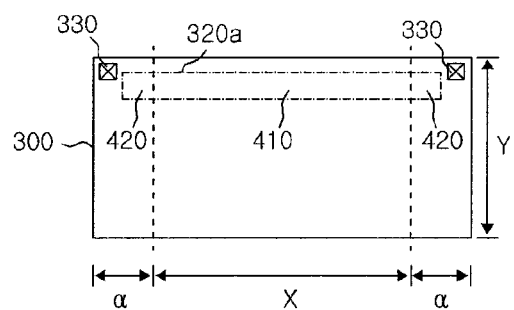

[FIG. 5]
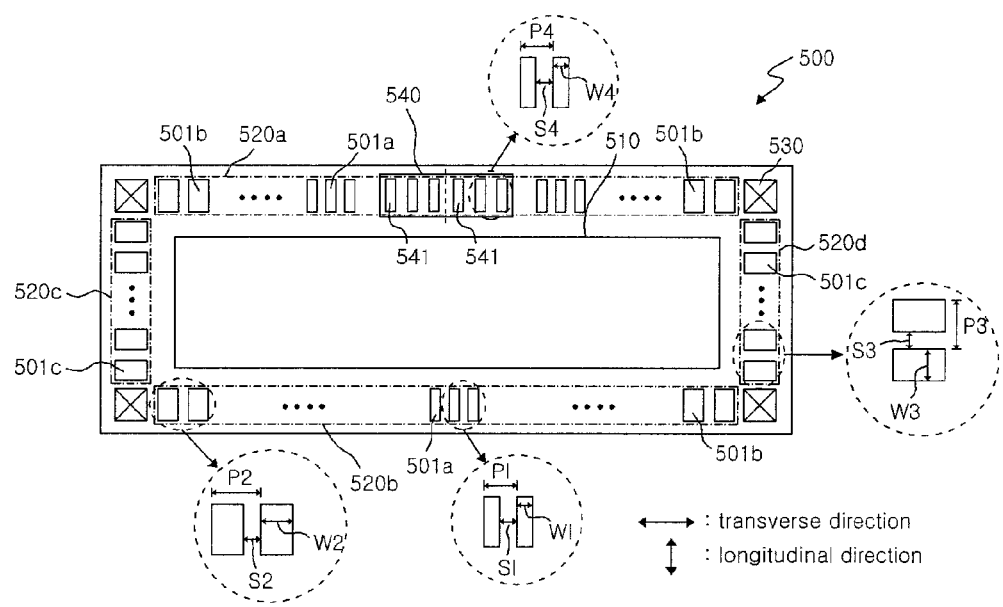

PAD LAYOUT STRUCTURE OF SEMICONDUCTOR CHIP

BACKGROUND OF THE INVENTION

1. Field of the Invention

The present invention relates to a pad layout structure of a semiconductor chip, and more particularly, to a pad layout structure of a semiconductor chip capable of preventing lead-broken problems when packaging the semiconductor chip in a tape carrier package.

2. Description of the Related Art

A tape carrier package (hereinafter, referred to as TCP) is obtained by applying a wireless bonding technique among techniques for packaging a highly integrated semiconductor chip. In general, the semiconductor chip is mounted on a TCP tape in which leads are formed as wires.

Since the TCP does not use separate bonding means such as gold wires unlike a conventional package that requires a wire bonding process, it is possible to obtain an inexpensive and compact package.

However, it is difficult to apply the TCP to a case where there are a large number of pads, and a pad pitch is small. For example, in case of a source driver chip for driving a liquid crystal panel, a large number of input and output pads for supplying power and transmitting signals are arranged in an area around an internal circuit of the source driver chip. However, the area for arranging the pads is limited with respect to the source driver chip. In order to arrange the input and output pads in the limited area, the pad pitch needs to be designed to a minimum within an allowable range for a procedure of manufacturing the semiconductor chip. Since the pad pitch in the semiconductor chip is designed to the minimum, a width of leads formed on the TCP tape is also small so as to package the semiconductor chip in a TCP.

As the width of leads decrease, a strength of leads also decreases. In case of a semiconductor chip with a low aspect ratio, although the width of the leads is decreased when packaging the semiconductor in a TCP, considerable problems do not occur. However, in case of a semiconductor chip with a high aspect ratio, for example, a ratio equal to or greater than 10:1, such as a source driver chip with an extremely high aspect ratio, lead-broken problems may occur due to even weak impact exerted on both edges of the semiconductor chip.

In order to prevent the lead-broken problems, the longitudinal length of the semiconductor chip has to be increased. Accordingly, it is difficult to miniaturize the semiconductor chip, since the longitudinal length of the semiconductor chip is increased without adding circuits.

FIG. 1 illustrates an example of a conventional pad layout structure of a semiconductor chip.

Referring to FIG. 1, an internal circuit 110 is disposed at the center of a semiconductor chip 100. Output pads 102 are arranged at upper, lower, left and right sides 120a, 120b, 120c, and 120d of the internal circuit 110. An input pad unit 101 is disposed at the center of the upper side 120a. As is not shown, the input pad unit 101 includes a plurality of input pads. The output pads 102 with a predetermined width W1 are arranged at a predetermined spacing S1. When the width of the pads and the spacing between neighboring pads are constant, a pad pitch represented by a sum of the width and the spacing is also constant.

As described above, in a case where the semiconductor chip 100 of FIG. 1 is a source driver chip, the semiconductor chip 100 generally has a long shape with a high aspect ratio. As shown in FIG. 1, in a case where the output pads are arranged at a predetermined pad pitch P1, lead-broken problems may occur at both edges 130 of the semiconductor chip 100 as described later.

FIG. 2 illustrates difference in moment between semiconductor chips due to difference in length between semiconductor chips.

Referring to FIG. 2, in case of (a), a length L1 from the center 210a to the edge 220a of a semiconductor chip 200a is relatively short. In case of (b), a length L2 from the center 210b to the edge 220b of a semiconductor chip 200b is relatively long. A moment of a semiconductor chip is proportional to a value obtained by multiplying a force F by the length L1 or L2 from the center 210a or 210b to the edge 220a or 220b of the semiconductor chip 200a or 200b. Accordingly, even when the same force F is applied to the output pads 102, the moment generated at the edge 220b of the semiconductor chip 200b is greater than the moment generated at the edge 220a of the semiconductor chip 200a.

Accordingly, even when the same force is applied to the output pads 102 due to a bonding tool when packaging a semiconductor chip 100 in a TCP, the moment generated at pads arranged at the edges 130 of the semiconductor chip 100 which are relatively far from the center of the semiconductor chip 100 is greater than the moment generated at pads arranged to be relatively near the center of the semiconductor chip 100. Since the moment is transferred to the leads formed on the TCP tape, the force applied to the leads arranged at the edges of the semiconductor chip 100 exceeds a yield strength of the leads. Thus, the leads may be broken.

SUMMARY OF THE INVENTION

The present invention provides a pad layout structure of a semiconductor chip capable of preventing lead-broken problems when packaging the semiconductor chip in a tape carrier package (TCP), although the semiconductor has a high aspect ratio.

According to an aspect of the present invention, there is provided a pad layout structure of a semiconductor chip, wherein a plurality pads are arranged along upper, lower, left and right sides of the semiconductor chip with a high aspect ratio, and wherein a longitudinal width of pads arranged at the left and right sides and a transverse width of pads arranged at both edges of the upper and lower sides are greater than a transverse width of pads arranged at centers of the upper and lower sides.

According to another aspect of the present invention, there is provided a pad layout structure of a semiconductor chip, wherein a plurality pads are arranged along upper, lower, left and right sides of the semiconductor chip with a high aspect ratio, and wherein a longitudinal width of pads arranged at the left and right sides is greater than a transverse width of pads arranged at the upper and lower sides.

According to another aspect of the present invention, there is provided a pad layout structure of a semiconductor chip, wherein a plurality pads are arranged along upper, lower, left and right sides of the semiconductor chip with a high aspect ratio, and wherein a transverse width of pads arranged at both edges of the upper and lower sides is greater than a transverse width of pads arranged at centers of the upper and lower sides.

According to another aspect of the present invention, there is provided a pad layout structure of a semiconductor chip, wherein a plurality pads are arranged along upper, lower, left and right sides of the semiconductor chip with a high aspect ratio, wherein a longitudinal width of pads arranged at both edges of the left and right sides is greater than a longitudinal width of pads arranged at centers of the left and right sides, and wherein a transverse width of pads arranged at both edges of the upper and lower sides is greater than a transverse width of pads arranged at centers of the upper and lower sides.

According to another aspect of the present invention, there is provided a pad layout structure of a semiconductor chip, wherein a plurality pads are arranged along upper, lower, left and right sides of the semiconductor chip with a high aspect ratio, wherein an input pad unit in which a plurality of input pads are arranged is formed at one or more sides of four sides including the upper, lower, left and right sides, and wherein a longitudinal width of output pads arranged at the left and right sides and a transverse width of output pads arranged at both edges of the upper and lower sides are greater than a transverse width of output pads arranged at centers of the upper and lower sides.

BRIEF DESCRIPTION OF THE DRAWINGS

The above and other features and advantages of the present invention will become more apparent by describing in detail exemplary embodiments thereof with reference to the attached drawings in which:

FIG. 1 illustrates an example of a conventional pad layout structure of a semiconductor chip;

FIG. 2 illustrates difference in moment between semiconductor chips based on difference in length between semiconductor chips;

FIG. 3 illustrates a pad layout structure of a semiconductor chip according to an embodiment of the present invention;

FIG. 4 illustrates a center and edges of an upper side of the semiconductor chip of FIG. 3; and FIG. 5 illustrates a pad layout structure of a semiconductor chip according to another embodiment of the present invention.

DETAILED DESCRIPTION OF THE INVENTION

Hereinafter, the present invention will be described in detail with reference to accompanying drawings.

FIG. 3 illustrates a pad layout structure of a semiconductor chip according to an embodiment of the present invention.

Referring to FIG. 3, a semiconductor chip 300 has a shape with a high aspect ratio. An internal circuit 310 is disposed at the center of the semiconductor chip 300. Pads 301a to 301c are arranged at upper, lower, left and right sides 320a, 320b, 320c, and 320d which are areas around the internal circuit 310 so as to arrange the pads. In regard to the pads 301a to 301c, it is preferable that the number of pads arranged in the left side is the same as that of pads arranged in the right side with respect to a virtual longitudinal line passing through the center of the semiconductor chip 300. It is preferable that the number of pads arranged in the upper side is the same as that of pads arranged in the lower side with respect to a virtual transverse line passing through the center of the semiconductor chip 300. More preferably, the pads have the same pad width and the same pad pitch. That is, the pads 301a to 301c are symmetrically arranged with respect to the virtual transverse or longitudinal line passing through the center of the semiconductor chip 300. In this case, it is advantageous in usage of the area for arranging the pads and advantageous in efficiency of manufacturing tape carrier package (TCP) tapes as compared with a case in which pads are arranged asymmetrically with respect to transverse or longitudinal lines passing through the center of the semiconductor chip.

Some of the pads 301a to 301c are output pads for outputting signals that are output from the internal circuit 310. The others of the pads 301a to 301c are input pads for transmitting power or signals to the internal circuit 310. Surely, some of the pads 301a to 301c may be input-output pads for inputting and outputting signals. Since the usage of the pads 301a to 301c arranged on the semiconductor chip 300 will be understood by those skilled in the art, the detailed description on the usage of the pads 301a to 301c will be omitted.

In a case where the semiconductor chip 300 may be a source driver chip, in general, the number of output pads is greater than that of input pads. For example, input pads are arranged at the center of the upper side 320a among the areas 320a to 320d for arranging the pads of the semiconductor chip 300. Output pads are arranged at the rest of the areas.

Pads 301c arranged on the left and right sides 320c and 320d among the pads 301a to 301c and pads 301b arranged on edges of the upper and lower sides 320a and 320b are farther from the center of the semiconductor chip 300 than pads 301a arranged at centers of the upper and lower sides 320a and 320b. As described above, since moments generated at the pads 301b and 301c arranged far from the center of the semiconductor chip 300 is proportional to the distance from the center of the semiconductor chip 300, a weak external force may break leads formed on the TCP tape when packaging the semiconductor chip 300 in a TCP.

It is possible to solve the lead-broken problem by allowing the longitudinal width W3 (hereinafter, referred to as a third pad width) of the pads 301c arranged at the left and right sides 320c and 320d and the transverse width W2 (hereinafter, referred to as a second pad width) of the pads 301b arranged at the both edges of the upper and lower sides 320a and 320b to be greater than the transverse width W1 (hereinafter, referred to as a first pad width) of the pads 301a arranged at the centers of the upper and lower sides 320a and 320b. At this time, the transverse width of the pads 301c arranged at the left and right sides 320c and 320d may be the same as the longitudinal width of the pads 301a and 301b arranged at the upper and lower sides 320a and 320b.

If widths W2 and W3 of the pads 301b and 301c far from the center of the semiconductor chip 300 are large, the width of leads formed on the TCP tape may be also enlarged. If the width of the leads is large, a yield strength of the leads is also large. It is possible to solve the lead-broken problem that occurs at parts relatively far from the center of the semiconductor chip 300, when packaging the semiconductor chip 300 in a TCP, to some degree.

FIG. 4 illustrates a center and edges of an upper side of the semiconductor chip shown in FIG. 3. Referring to FIG. 4, the upper side 320a of the semiconductor chip 300 may be divided into a center 410 and two edges 420.

For example, it is assumed that a ratio of the transverse length X+2α to the longitudinal length Y is greater than 10:1 and that a ratio of X to Y is 10:1. It is also assumed that the ratio of the transverse length to the longitudinal length of the semiconductor chip 300 that is 10:1 indicates the maximum ratio in which the lead-broken problem does not occur, when packaging the semiconductor chip 300 in a TCP, in a case where the pads with a minimum pad width or minimum pad pitch are arranged. In this case, as described above, the lead-broken problem may occur at both edges 420 of the upper side 320a when packaging the semiconductor chip 300 in a TCP.

Here, the ratio of the transverse length to the longitudinal length of the semiconductor chip which is suggested as an example of the maximum ratio in which the lead-broken problem dose not occur is 10:1. The ratio of 10:1 is the maximum ratio in which the lead-broken problem dose not occur in the edges of the semiconductor chip, in a case where a force exerted on a bonding tool is constant when packaging the semiconductor chip in a TCP. Accordingly, the ratio of 10:1 may be changed based on the force exerted on the bonding tool or based on the pad pitch of pads. In addition, the ratio of 10:1 may be adjusted by changing the force exerted on the bonding tool when packaging the semiconductor chip in a TCP or by changing the pad pitch.

In an example of an arrangement of pads at the upper side 320a of FIG. 4, the second pad width W2 of the pads 301b arranged at both edges of the upper side 320a is greater than the first pad width W1 of the pads 301a arranged at the center 410 of the upper side 320a.

The center 410 of the upper side 320a is relatively near the center of the semiconductor chip 300. Accordingly, in the center 410, pads 301a with a minimum pad width W1 and a minimum pad spacing S1, that is, a minimum pad pitch P1 which are predetermined in a procedure of manufacturing semiconductor chips may be arranged.

On the other hand, the both edges 420 of the upper side 320a are relatively far from the center of the semiconductor chip 300. Since the lead-broken problem may occur in these parts when packaging the semiconductor chip 300 in a TCP, the pads 301b arranged on both edges of the upper side 320a have the second pad width W2 greater than the first pad width W1 of the pads 301a arranged at the center of the upper side 320a.

N (N is a natural number equal to or greater than 1) number of pads 301b with the second pad width W2 may be arranged at both edges 420 of the upper side 320a from corners at which align keys 330 are arranged. However, the number N of pads 301b having the relatively large transverse width W2 so as to prevent lead-broken problems when packaging the semiconductor chip in a TCP is not determined. The number N of the pads 301 with a relatively large transverse width W2 is changed based on the ratio $(X+2\alpha):Y$ of the transverse length to the longitudinal length of the semiconductor chip 300. If the length X of the center 410 of the upper side 320a is determined as a predetermined value, the number N of the pads 301 with the relatively large transverse width W2 is determined based on the length $2\alpha$ of the both edges of the upper side 320a. At this time, the length X of the center 410 of the upper side 320a is determined based on the ratio (for example, X:Y=10:1) of the length X of the center 410 to the longitudinal length Y of the semiconductor chip 300. Pads with a minimum pad pitch in an allowable range for the procedure of manufacturing semiconductor chips may be arranged at the center 410 of the upper side 320a of which length is X.

In the aforementioned example, the length X of the center 410 of the upper side 320a in which the pads 301a with the minimum pad width are arranged in the minimum spacing may not exceed ten times of the longitudinal length Y of the semiconductor chip 300. The pads 301b with the second pad width W2 greater than the first pad width W1 of the pads 301a arranged on the center 410 of the upper side 320a may be arranged on the rest parts 420 of the upper side 320a.

If the length $2\alpha$ of the both edges 420 of the upper side 320a is small, a small number of pads 301b with the second pad width W2 are arranged. If the length $2\alpha$ of the both edges 420 of the upper side 320a is large, a large number of pads 301b with the second pad width W2 are arranged. The pads 301b with a constant width may be arranged on the both edges 420 of the upper side 320a. Alternatively, the width of the pads increase, as the pads becomes far from the center of the semiconductor chip 300.

In a case where the spacing between the pads 301a and the spacing between the pads 301b are constant, if the second pad width W2 of the pads 301b arranged at the both edges 420 is greater than the first pad width W1 of the pads 301a arranged at the center 410 of the upper side 320a, the pad pitch P2 of the pads 301a arranged at the both edges 420 is greater than the pad pitch P1 of the pads 301a arranged at the center 410. Surely, the pad pitch may be increased or decreased by changing the pad width or spacing between the pads.

Although the upper side 320a of the semiconductor chip 300 is shown in FIG. 4, similarly, the lower side 320b of the semiconductor chip 300 may be divided into the center 410 and the both edges 420.

In addition, since the left and right sides 320c and 320d are relatively far from the center of the semiconductor chip 300, pads 301c with the third pad width W3 greater than the pad width of the pads 301a arranged at the center 410 of the upper side 320a may be arranged at the left and right sides 320c and 320d. Here, the pad pitch P2 of the pads 301b arranged at the both edges 420 of the upper and lower sides 320a and 320b of the semiconductor chip 300 may be the same as the pad pitch P3 of the pads 301c arranged at the left and right sides 320c and 320d.

In this case, the pads 301c arranged at the left side 320c and the pads 301b arranged at the left edges of the upper and lower sides 320a and 320b construct a shape of ⊏. The pads 301c arranged at the right side 320c and pads 301b arranged at the right edges 420 of the upper and lower sides 320a and 320b construct the same shape.

As is not shown in the drawing, the pads arranged at the centers of the left and right sides 320c and 320d have the pad width equal to or greater than the first pad width W1 of the pads 301a arranged at the center 410 of the upper side 320a. The pads arranged at the both edges have the pad width greater than the pad width of the pads arranged at the centers of the left and right sides 320c and 320d. In this case, the pads 301c arranged at one edge of the left or right side 320c or 320d and the pads 301b arranged at one edge of the upper or lower side 320a and 320b construct a shape of ⊐.

Pads are not arranged at four corners of the semiconductor chip 300 at which the upper and lower sides 320a and 320b cross the left and right sides 320c and 320d. The align keys 330 for aligning the semiconductor chip 300 and the bonding tool (not shown) when packaging the semiconductor chip 300 in a TCP may be arranged at the four corners of the semiconductor chip 300. When there are the align keys 330, the pads 301a and 301b are arranged between two of the align keys 330

FIG. 5 illustrates a pad layout structure of a semiconductor chip according to another embodiment of the present invention.

Like the semiconductor chip 300 of FIG. 3, a semiconductor chip 500 of FIG. 5 has a relatively high aspect ratio. An internal circuit 510 is disposed at the center of the semiconductor chip 500. Output pads 501a to 501c are arranged at upper, lower, left and right sides 520a, 520b, 520c, and 520d which are areas around the internal circuit 510 so as to arrange the pads. In addition, align keys 530 may be arranged at four corners of the semiconductor chip 500.

Referring to FIG. 5, a third pad width W3 of output pads 501c arranged at the left and right sides 520c and 520d and a second pad width W2 of output pads 501b arranged at both edges of the upper and lower sides 520a and 520b are greater than a first pad width W1 of output pads 501a arranged at the centers of the upper and lower sides 520a and 520b.

In other words, a pad pitch P3 of the output pads 501c arranged at the left and right sides 520c and 520d and a pad pitch P2 of the output pads 501b arranged at the both edges of the upper and lower sides 520a and 520b are greater than a pad pitch P1 of the output pads 501a arranged at the centers of the upper and lower sides 520a and 520b.

Then, an input pad unit 540 for transmitting power or signals to the internal circuit 510 is disposed at one or more sides of the four sides including the upper, lower, left, and right sides 520a, 520b, 520c, and 520d.

A plurality of input pads 541 are arranged in the input pad unit 540. In a case where the input pad unit 540 is disposed at the center of the upper or lower side 520a or 520b of the semiconductor chip 500, the input pads 541 to be arranged in the input pad unit 540 may be arranged to have bilateral symmetry. In a case where the input pad unit 540 is disposed at the center of the left or right side 520c or 520d of the semiconductor chip 500, the input pads 541 to be arranged in the input pad unit 540 may be arranged to have symmetry of upper and lower parts.

The input pads 541 to be arranged in the input pad unit 540 may be arranged in the semiconductor chip 500 similarly to the arrangement of the output pads 501a to 501c. That is, a pad width W4 of the input pads 541 arranged at the both edges of the upper and lower sides 520a and 520b relatively far from the center of the semiconductor chip 500 or arranged at the left or right side 520c or 520d is greater than the pad width W4 of the input pads 541 arranged at the centers of the upper or lower side 520a or 520b relatively near the center of the semiconductor chip 500.

FIG. 5 illustrates an example in which the input pad unit 540 is disposed at the center of the upper side 520a. The input pads 541 are arranged in the input pad unit 540 to have bilateral symmetry. The input pads 541 with a constant pad width W4 and a constant pad spacing S4, that is, a constant pad pitch P4, may be arranged. At this time, the pad width W4 of the input pads 541 may be the same as the pad width W1 of the output pads 501a arranged at the center of the upper or lower side 520a or 520b.

In embodiments shown in FIGS. 3 and 5, pads with a relatively large pad width W2 or W3 are arranged at both edges of the upper and lower sides 320a and 320b or 520a and 520b and arranged at the left and right sides 320c and 320d or 520c and 520d to have a shape of ⊏.. These examples are useful to prevent lead-broken problems when packaging the semiconductor chip in a TCP, in a case where the semiconductor chip 300 or 500 has a high aspect ratio.

In some cases, pads with the second pad width W2 that is relatively large may be arranged at the both edges 420 (FIG. 4) of the upper and lower sides 320a and 320b or 520a and 520b of the semiconductor chip 300 or 500. In addition, pads with the third pad width W3 that is relatively large may be arranged at the left and right sides 320c and 320d or 520c and 520d. The former case is available for a case where pads may be arranged only at the upper and lower sides 320a and 320b or 520a and 520b of the semiconductor chip 300 or 500. The latter case is available for a case where the semiconductor chip 300 or 500 does not have a high aspect ratio.

Although the transverse or longitudinal pad width of pads has been described up to now, the pad width has close relation to the pad pitch. Specifically, in a case where the spacing between pads is constant, when the pad width is large, the pad pitch is also large. In the examples shown in FIGS. 3 and 4, if the second pad width W2 of the pads 301b arranged at the both edges 420 of the upper side 320a of the semiconductor chip 320a is greater than the first pad width W1 of the pads 301a arranged at the center 410 of the upper side 320a, the pad pitch P2 of the pads 301b arranged at the both edges 420 of the upper side 320a is greater than the pad pitch P1 of the pads 301a arranged at the center 410 of the upper side 320a.

As described above, it is possible to prevent lead-broken problems when packaging a semiconductor chip with a high aspect ratio in a tape carrier package (TCP) by using a pad layout structure in which a pad width of pads relatively far from the center of the semiconductor chip is relatively large.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A pad layout structure of a semiconductor chip for preventing lead-broken problem of the semiconductor chip, wherein the semiconductor chip has a rectangular shape of which longitudinal length is greater than its transverse length, the pad layout structure comprising:
   a plurality of IO (input/output) pads arranged along upper, lower, left and right sides of the semiconductor chip with a high aspect ratio,
   wherein the plurality of IO pads include first IO pads that are arranged along the upper and lower sides having the longitudinal length of the semiconductor chip, and second IO pads that are arranged along the left and right sides having the transverse length of the semiconductor chip,
   wherein the first IO pads each have a width in a direction of the longitudinal length of the semiconductor chip, and first IO pads disposed at edges of the upper and lower sides have widths greater than widths of first IO pads disposed at a center area of the upper and lower sides.

2. The pad layout structure of claim 1, wherein the IO pads arranged at the left and right sides and the IO pads arranged at the edges of the upper and lower sides are disposed to surround the left and right sides and the edges of upper and lower sides of the semiconductor chip.

3. The pad layout structure of claim 1,
   Wherein IO pads arranged at the left side of the semiconductor chip and IO pads arranged at the right side are arranged to have bilateral symmetry, and
   Wherein IO pads arranged at the upper side of the semiconductor chip and IO pads arranged at the lower side are arranged to have symmetry of upper and lower parts.

4. The pad layout structure of claim 1, wherein an align key is disposed at each corner at which the upper or lower side crosses the left or right side.

5. The pad layout structure of claim 1, wherein the first IO pads each have a length in the direction of the transverse length of the semiconductor chip, the second IO pads each have a length in the direction of the longitudinal length of the semiconductor chip, and the length of the first IO pads is identical with the length of the second IO pads.

6. The pad layout structure of claim 1, wherein the second IO pads each have a width in a direction of the transverse length of the semiconductor chip, and the width of the second IO pads is greater than the widths of the first IO pads disposed at the center area of the upper and lower sides of the semiconductor chip.

* * * * *